(12) United States Patent
Phoon et al.

(10) Patent No.: US 7,304,497 B2
(45) Date of Patent: Dec. 4, 2007

(54) METHODS AND APPARATUS FOR PROGRAMMABLY POWERING DOWN STRUCTURED APPLICATION-SPECIFIC INTEGRATED CIRCUITS

(75) Inventors: Hee Kong Phoon, Perak (MY); Kar Keng Chua, Penang (MY)

(73) Assignee: Altera Corporation, San Jose, CA (US)

( * ) Notice: Subject to any disclaimer, the term of this patent is extended or adjusted under 35 U.S.C. 154(b) by 60 days.

(21) Appl. No.: 11/119,312

(22) Filed: Apr. 29, 2005

(65) Prior Publication Data
US 2006/0279330 A1 Dec. 14, 2006

(51) Int. Cl.
G06F 7/38 (2006.01)
H03K 19/173 (2006.01)
H01L 25/00 (2006.01)
H01L 29/00 (2006.01)

(52) U.S. Cl. ............................ 326/38; 326/37; 326/39; 326/40; 326/41; 326/47; 326/101; 257/529

(58) Field of Classification Search ............ 326/37–41, 326/47, 101; 257/529
See application file for complete search history.

(56) References Cited

U.S. PATENT DOCUMENTS

| | | | |
|---|---|---|---|
| 4,645,953 A * | 2/1987 | Wong ........................... 326/42 |
| 6,331,790 B1 * | 12/2001 | Or-Bach et al. ............... 326/41 |
| 6,577,520 B1 * | 6/2003 | Mick ........................... 365/49 |
| 6,861,739 B1 * | 3/2005 | Bhavnagarwala et al. .. 257/691 |
| 6,988,258 B2 * | 1/2006 | Tan et al. ...................... 716/17 |
| 2003/0234666 A1 * | 12/2003 | Cox ............................. 326/38 |
| 2004/0088672 A1 * | 5/2004 | Ting ............................. 716/17 |
| 2005/0152081 A1 * | 7/2005 | Worley ......................... 361/56 |
| 2006/0001444 A1 | 1/2006 | Chua et al. |
| 2006/0022705 A1 * | 2/2006 | Or-Bach et al. ............... 326/41 |

OTHER PUBLICATIONS

U.S. Appl. No. 11/050,607, filed Feb. 3, 2005, Schleicher et al.

* cited by examiner

*Primary Examiner*—Rexford Barnie
*Assistant Examiner*—Thienvu Tran
(74) *Attorney, Agent, or Firm*—Fish & Neave IP Group, Ropes & Gray LLP; Jeffrey C. Aldridge

(57) ABSTRACT

Methods and apparatus for programmably powering down a structured application-specific integrated circuit are provided. At least one of the programmable layers of the structured ASIC that frequently provides some programmability as between or among a small number of alternative functions is used to provide this programmability.

14 Claims, 8 Drawing Sheets

METHODS AND APPARATUS FOR PROGRAMMABLY POWERING DOWN STRUCTURED APPLICATION-SPECIFIC INTEGRATED CIRCUITS

BACKGROUND OF THE INVENTION

The present invention relates generally to structured application-specific integrated circuits ("ASICs"), and more particularly to methods and apparatus for programmably powering down such structured ASICs.

So-called structured ASICs are sometimes used as alternatives to programmable logic devices ("PLDs"), such as field-programmable gate arrays ("FPGAs"). An FPGA has a generic structure that may include many identical blocks of logic circuitry, many registers, and a number of other types of circuit blocks, such as I/O blocks, RAM blocks, DSP blocks, PLL/DLL blocks, etc. These various circuitries are programmable to perform any of a variety of tasks. An FPGA also has a generic interconnection structure. This structure is programmable to interconnect the other circuitries on the device in any of many different ways. The logic blocks of such an FPGA may be referred to as logic elements, logic modules, adaptive logic elements, or adaptive logic modules ("LEs", "LMs", "ALEs", or "ALMs").

A known type of structured ASIC equivalent to an FPGA has a generic structure that includes many identical instances of a relatively simple circuit block (a so-called hybrid logic element or "HLE"). The structured ASIC may also generically include other blocks that are comparable to the special-purpose blocks on a related FPGA (e.g., I/O blocks, RAM blocks, PLL/DLL blocks, etc.). These generic attributes of the structured ASIC are embodied (at least to some extent) in several of the masks used to make the ASIC. These masks can therefore be the same or substantially the same for all ASICs of this general kind, and they give the ASIC its "structure." Other masks (but only some of the total mask set) are customized to give the structured ASIC particular functionality that is equivalent to the functionality of a related, programmed FPGA. For example, these customized masks may configure an HLE or a small group or cluster of HLEs (a complex HLE or "CHLE") to perform functions equivalent to those performed by an ALE in the related programmed FPGA. Similarly, the customized masks may configure a CHLE to perform functions equivalent to a register in the related programmed FPGA. The customized masks may also provide interconnections between HLEs, CHLEs, and/or other circuit blocks on the ASIC. These interconnections will typically include interconnections equivalent to those provided by the programmable interconnection resources of the related programmed FPGA.

Therefore, a structured ASIC typically has a number of fixed layers including fixed semiconductor layers and fixed metallization layers, with provisions for one or more programmable layer (metal or via, as described below in more detail) to be added to implement the design of the related programmed FPGA. Among the structures in the fixed layers are I/O ports, which may or may not be used in a particular FPGA design.

Using a structured ASIC of this kind and in this way has a number of advantages. For example, only some of the ASIC masks need to be customized. This tends to reduce ASIC cost and to speed up the ASIC design/production cycle. It also reduces the risk of a design flaw in the ASIC, and it facilitates producing an ASIC that is a close operational equivalent to the related programmed FPGA (e.g., pin-for-pin identity, timing identity or near identity, etc.). Another advantage of this approach is that it tends to allow the ASIC to include less circuitry (including less circuitry for normal operations) than the related FPGA. This is so because only as many ASIC HLEs as necessary are devoted to performing the functions of each FPGA ALE, and in almost all FPGAs many ALEs are less than fully utilized.

Efficient and reliable conversion from FPGA designs to structured ASIC designs (and vice versa) is important to provision of FPGAs and ASICs that are equivalent to one another. For example, after a design has been proven in an FPGA, it may be desired to migrate that design to an ASIC in order to lower unit cost. As another example, it may be desired to use an FPGA to prototype a design that is really intended for ASIC implementation. However, in a typical structured ASIC design, some active devices are unusable due to routing or placement constraints. Presently, to reduce the leakage power through the device, filler cells are used to fill in this unusable area and all of the inputs of the unused device are tied to a power source. While this approach may help to reduce the leakage power through the unused device, there is still a small amount of current that will flow through the stable state device as a leakage current. In deep sub-micron technology, the steady state or off state leakage current becomes higher and introduces a significant impact to the overall power system.

Accordingly, it would be desirable to provide methods and apparatus for programmably powering down a structured application-specific integrated circuit by totally disconnecting the power source from the unused device to reduce the leakage current.

SUMMARY OF THE INVENTION

In accordance with the present invention, methods and apparatus for programmably powering down a structured application-specific integrated circuit are provided.

The present invention relies on at least one of the "programmable" layers of the structured ASIC that frequently provides some programmability as between or among a small number of alternative functions. In accordance with this invention, such a programmable layer is used to configure the power source programming of each logic module of the ASIC design. The layer may be a metallization layer in which programmable connections (e.g., fuses) are used to make or break connections between segments of the layer, or a semiconductor layer in which programmable vias may be used to make or break connections between metallization layers on either side of the semiconductor layer. The present invention eliminates power leakage through unused devices on the structured ASIC, allows for each logic module to be powered down separately, and achieves high performance design while maintaining low power targets in deep sub-micron technology.

In accordance with one embodiment of the present invention, there is provided a structured application-specific integrated circuit device that includes a plurality of base semiconductor layers and a plurality of base metallization layers, wherein the base layers form at least one hard circuit block at a first location. A first portion of a first one of the metallization base layers at the first location is configured as a first global power bus line for the ASIC device. A second portion of a second one of the metallization base layers at the first location is configured as a first local power bus line for the at least one hard circuit block. A third portion of a third one of the base layers is programmable to control the connection between the first portion of the first one of the metallization base layers and the second portion of the second one of the metallization base layers for programmably powering down the at least one hard circuit block.

BRIEF DESCRIPTION OF THE DRAWINGS

The above and other advantages of the invention will be more apparent upon consideration of the following detailed description, taken in conjunction with the accompanying drawings, in which like reference characters refer to like parts throughout, and in which.

DETAILED DESCRIPTION OF THE PREFERRED EMBODIMENTS

This specification illustrates the invention in the context of migrating logic designs from a particular type of FPGA to a particular type of structured ASIC. These types of FPGAs and structured ASICs are explained in more detail in such references as Chua et al. U.S. patent application Ser. No. 10/884,460, filed Jul. 2, 2004, and Schleicher et al. U.S. patent application Ser. No. 11/050,607, filed Feb. 3, 2005, which are hereby incorporated by reference herein in their entireties. To facilitate understanding of the present invention without the need for reference to any other document, however, the next several paragraphs and related FIGS. 1-9 are reproduced (with only minor modifications) from the above-mentioned Chua et al. and Schleicher et al. references.

Figure 1:
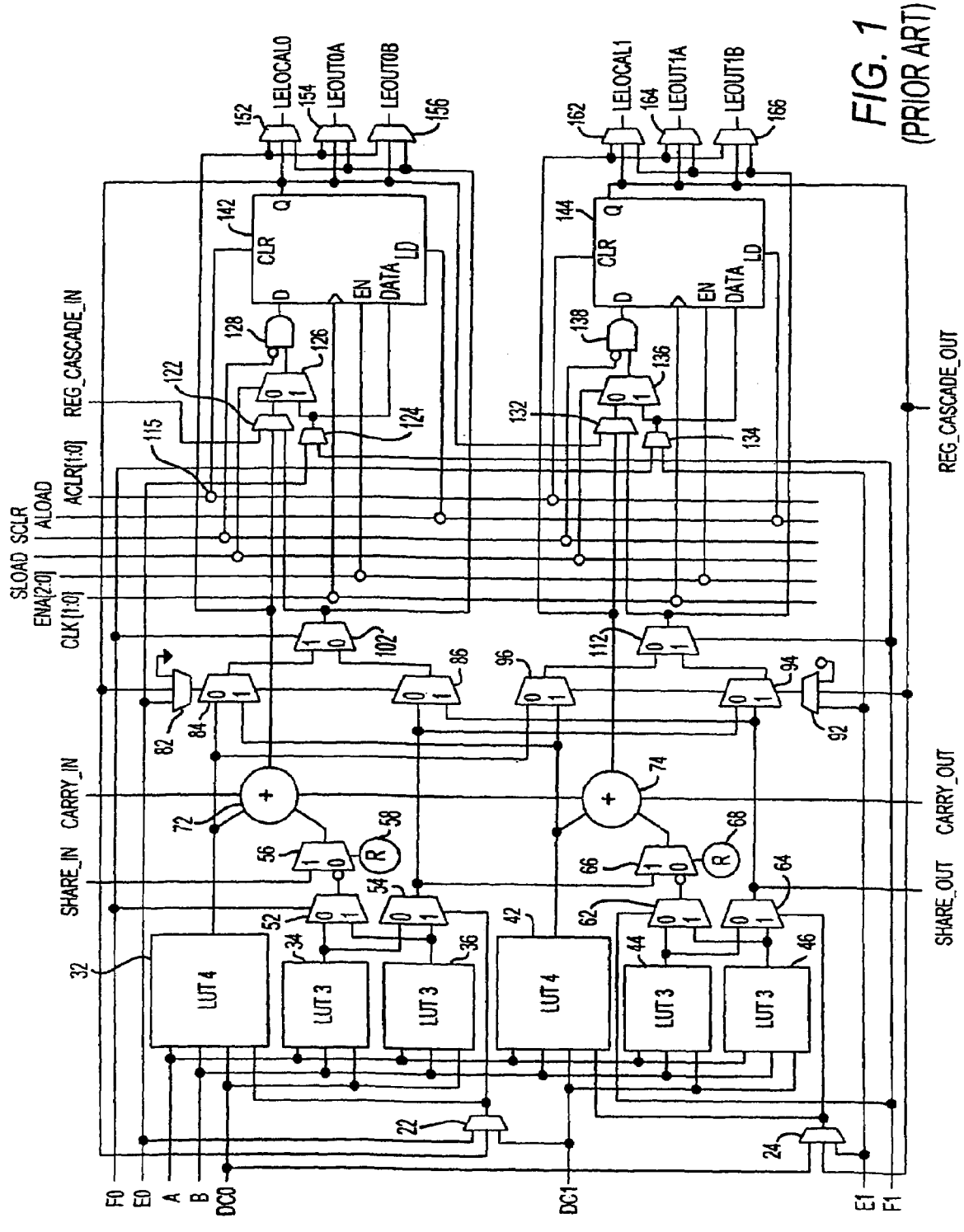
FIG. 1 is a simplified schematic block diagram of an illustrative basic unit of FPGA circuitry that is known to those skilled in the art.

An illustrative example of a basic logic circuit building block or unit 10 for inclusion in an FPGA is shown in FIG. 1. This FPGA building block circuitry (also sometimes referred to as an adaptive logic element ("ALE") or an adaptive logic module ("ALM")) is known to those skilled in the art and can therefore be described in a somewhat abbreviated way herein. ALE 10 includes multiplexers 22, 24, 52, 54, 56, 62, 64, 66, 82, 84, 86, 92, 94, 96, 102, 112, 122, 124, 126, 132, 134, 136, 152, 154, 156, 162, 164, and 166. Most of these multiplexers are programmably controlled by programmable random access memory ("RAM") bits that are generally not shown in the drawings (although RAM bits 58 and 68 in FIG. 1 are illustrative). Some of these multiplexers are more dynamically controlled by signals that can change during normal operation of the device. Multiplexer 112 is an example of this latter type of multiplexer. It is controlled by input F1 to ALE 10.

ALE 10 also includes look-up tables ("LUTs") 32, 34, 36, 42, 44, and 46. LUTs 32 and 42 are four-input look-up tables. The other LUTs are three-input look-up tables. Each of these LUTs is programmable to provide an output signal that is any logical combination of the input signals to that LUT.

Other components of ALE 10 are full adders 72 and 74, AND gates 128 and 138, and flip-flops 142 and 144. The conductor interconnections shown by open circles (e.g., connection 115) are programmable interconnections, which means that the interconnection may or may not be made, as desired by the user.

The LUT resources of ALE 10 are sufficient to enable the ALE to form any logical combination of up to six inputs to the ALE. Alternatively, if two somewhat smaller functions have some inputs in common, then the LUT resources of ALE 10 may be sufficient to perform two such functions. For example, it may be possible for an ALE 10 to form two five-input combinations, two four-input combinations, etc.

Full adders 72 and 74 enhance the arithmetic capabilities of ALE 10. For example, these components give ALE 10 the ability to perform two adjacent places of the binary addition of two numbers, including the handling of carry in and carry out signals.

Registers 142 and 144 (and associated circuitry) allow signals in ALE 10 to be either registered (by a register) or unregistered (bypassing a register). An ALE 10 register does not have to be used to register a signal originating in the ALE. A register can instead be used (in so-called lonely register mode) to register an input signal to the ALE. Other circuitry of the ALE can be used for other purposes while one or both of registers 142 and 144 are used in lonely register mode. Registers 142 and 144 are also capable of operating in different asynchronous or synchronous modes. "D" is the normal data input to each register; "DATA"0 is the asynchronous load data.

Figure 2:
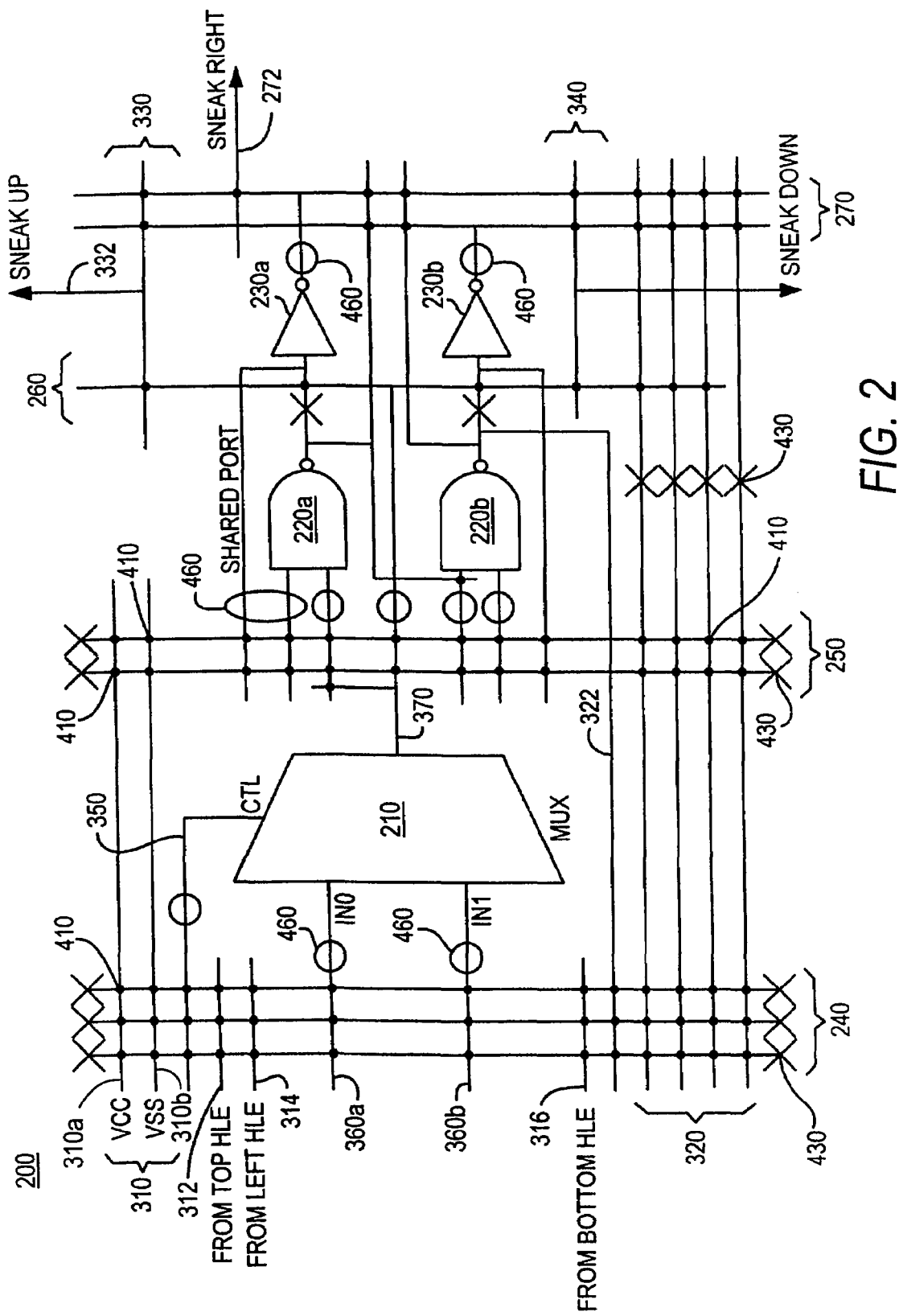
FIG. 2 is a simplified schematic block diagram of an illustrative basic unit of structured ASIC circuitry that is useful in explaining certain aspects of the present invention.

FIG. 2 shows an example of a basic logic circuit building block or unit 200 for inclusion in a structured ASIC. FIG. 2 herein is the same as FIG. 3 in the above-mentioned Chua et al. reference. Accordingly, the description of FIG. 2 can be somewhat abbreviated herein. Building block 200 may also be referred to as a hybrid logic element or HLE.

HLE 200 includes two-input multiplexer 210, NAND gates 220a and 220b, inverters 230a and 230b, and interconnection resources that are described more fully in the next several sentences. The interconnection resources shown in FIG. 2 include a plurality of vertical conductors 240 upstream from multiplexer 210, a plurality of vertical conductors 250 between multiplexer 210 and NAND gates 220, one (or more) vertical conductor(s) 260 between NAND gates 220 and drivers 230, and a plurality of vertical conductors 270 downstream from drivers 230. The interconnection resources shown in FIG. 2 also include several horizontal conductors (e.g., conductors 310, 320, 330, and 340). Conductors 240, 250, 260, 270, 310, 320, 330, and 340 are relatively general-purpose conductors, by which it is meant that they can be used to make any of several different links between any of several different sources and any of several different destinations. In addition to these relatively general-purpose conductors, HLE 200 includes several more-specialized conductors. For example, conductor 350 is dedicated to supplying the control input to multiplexer 210 (although there can be any of several sources for that control input signal, and conductor 350 can also be put to other use if desired). As another example, conductors 360a and 360b are dedicated to supplying the two selectable inputs to multiplexer 210 (again from any of several possible sources, and again with additional possible use if desired). As still another example, conductor 370 is dedicated to conveying the output of multiplexer 210, although that output can go to any of several destinations. Although some conductors have been described as relatively general-purpose, and other conductors are described as more specialized, these descriptive concepts are employed only for convenience. They are not intended to be limiting. Nor is there any definite distinction between the two, or any necessity for both types to be present.

Figure 4:
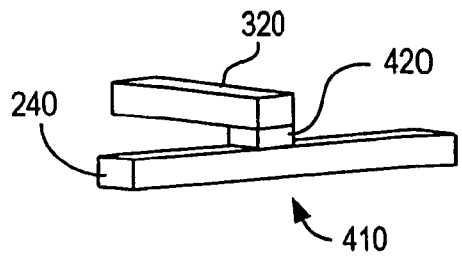
FIGS. 4-9 are simplified perspective or elevational views of illustrative programmable interconnect structures for ASICs in accordance with the invention.
Figure 5:
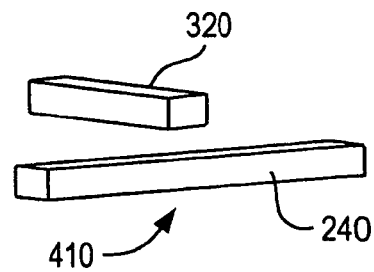

The small solid dots 410 at conductor intersections in FIG. 2 represent locations at which connections between the intersecting conductors can be made or not made as desired. These connections are therefore programmable. In the preferred embodiments, these connections are mask-programmable using vias that are either included or not included in one or more layers between the layers containing the intersecting conductors. (Although via programming is generally referred to herein, this is only an example, and any of several other programming technologies can be used instead if desired. Other examples of usable programming technologies are mentioned later in this specification.) FIG. 4 shows two intersecting conductors 240 and 320 in respective different metal layers on an integrated circuit device that includes HLE 200. In FIG. 4 these conductors are electrically connected to one another by a via 420 through an insulating layer between the two metal layers. The same structure is shown again in FIG. 5 without a via through the insulating layer. Accordingly, in FIG. 5 conductors 240 and 320 are not connected to one another. (Whether conductor 240 or 320 is in the higher or lower metal layer is arbitrary and a matter of design choice.)

Figure 6:
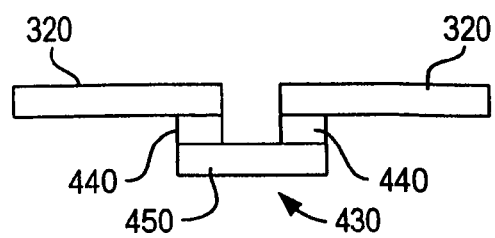
Figure 7:
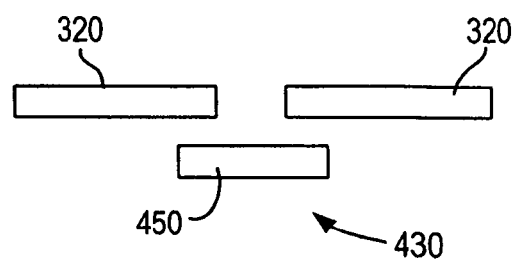

The Xs 430 in FIG. 2 represent locations at which conductor segments can be programmably connected to one another or not as desired. The same technology choices as described above for small solid dots 410 are suitable for connections 430. Because the presently preferred embodiment uses mask-programmable vias, that will generally be the choice shown and described herein. FIG. 6 shows two segments of representative conductor 320 connected by mask-programmable vias 440 to bridging conductor 450. Accordingly, these two segments of conductor 320 are electrically connected to one another by way of vias 440 and bridging conductor 450. FIG. 7 shows the same structure but without vias 440. Accordingly, in FIG. 7 conductor segments are not connected to one another. Rather, they are electrically insulated from one another.

Figure 8:
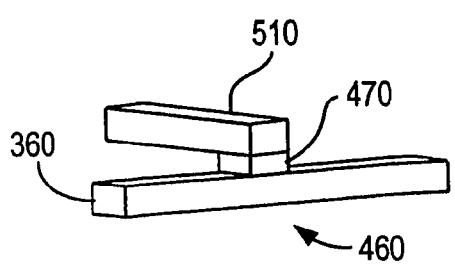
Figure 9:
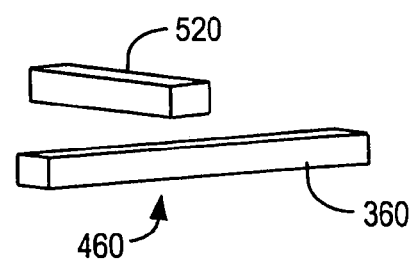

The large open circles or ovals 460 in FIG. 2 represent locations at which the conductors having those circles or ovals can be programmably connected to what may be called a higher level of interconnection resources (not shown in FIG. 2) on a device that includes HLE 200. This higher level of interconnection resources may be used for such purposes as conveying signals between components (e.g., HLEs, device input/output ("I/O") ports, etc.) that may not be adjacent or relatively close to one another. (The phrase "higher level" does not necessarily mean a physically higher level, but only a hierarchically higher level.) Programmable connections 460 can be made in any of the ways described above (e.g., for programmable connections 410). Again, because mask-programmable vias are the presently preferred embodiments, these will generally be assumed and described for programmable connections 460. Accordingly, FIG. 8 shows representative conductor 360 connected to higher level conductor 510 by mask-programmable via 470. FIG. 9 shows the same structural location 460 again, but now with no connection between conductor 360 and higher level conductor 520.

In FIG. 2, conductors shown extending along different axes always connect to one another if one of these conductors is shown ending at the other conductor (or if both conductors are shown ending at the other conductor). Conductors shown crossing one another without a small solid dot at the intersection are not connectable to one another at the intersection.

Certain conductors are shown in FIG. 2 as having particular external connections. Thus the top-most conductor 310a of global power bus line 310 is shown as always connected to VCC (e.g., logic 1). The next-to-top-most conductor 310b of global power bus line 310 in FIG. 2 is shown as always connected to VSS (e.g., logic 0). Conductors 312, 314, and 316 are shown as input connections from other adjacent HLEs above, to the left, and below the depicted HLE. Conductor 332 provides the input 316 to the HLE above the depicted HLE. Conductor 272 provides the input 314 to the HLE to the right of the depicted HLE. Conductor 270 provides the input 312 to the HLE below the depicted HLE. These so-called "sneak" connections between adjacent or nearby HLEs can be an always-provided, fixed part of the interconnection resources of the device. Whether they are actually used (and how they are used) can be programmable as a result of how the programmable connections 410 at one or both ends of the sneak connections are programmed.

The Xs 430 at the depicted ends of conductors like 240 and 250 represent locations at which those conductors can be programmably connected to similar conductors in other HLEs adjacent to the depicted HLE. Again, these connections and inter-connections are made by appropriately customizing one or more of the masks used to make the ASIC.

Before proceeding further it should be mentioned that in addition to having many ALEs, an FPGA may also have a number of instances of other types of circuitry. Examples of such other types of circuitry include (but are not limited to) input/output ("I/O") blocks, memory blocks, digital signal processing ("DSP") blocks, phase-locked loop ("PLL") and digital phase-locked loop ("DPLL") blocks, and other types of processor circuitry. Such blocks may sometimes be referred to as hard circuit blocks or hard IP blocks. A structured ASIC device may also have (in addition to many HLEs) the same hard circuit blocks. Inclusion of the same hard blocks in structured ASICs and FPGAs that can provide equivalents of one another greatly facilitates providing such equivalents, as described in the above-mentioned Schleicher et al. reference.

Figure 3:
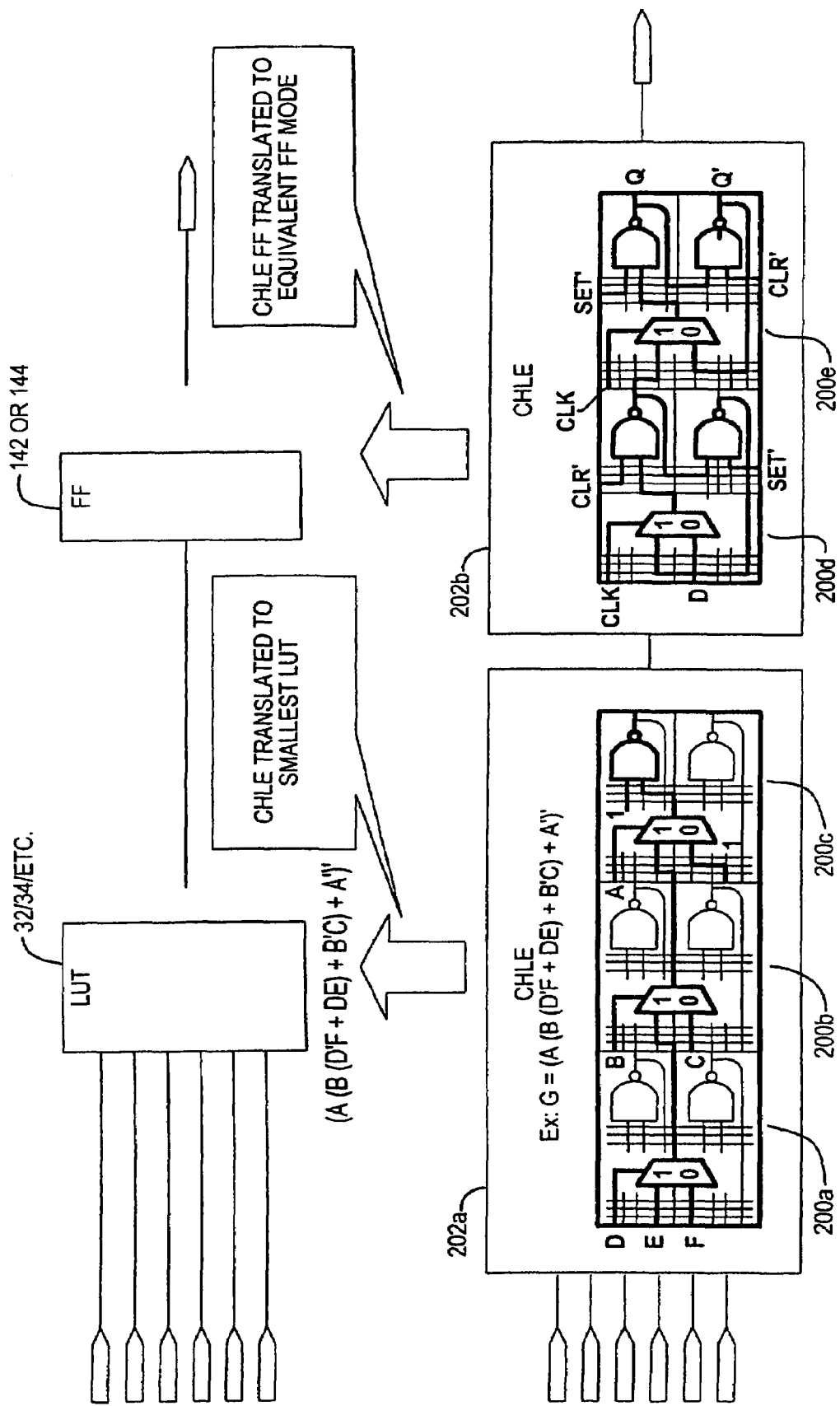
FIG. 3 is a simplified schematic block diagram showing equivalent implementations of certain circuit functions in structured ASIC and FPGA circuitry.

One HLE 200, or a relatively small but suitable number of adjacent or nearby HLEs 200, can be used to perform any function or functions that can be performed by an FPGA LE such as 10 in FIG. 1. In each case, only as many HLEs as are required to perform the LE's function(s) are employed to produce an ASIC equivalent of the FPGA LE. FIG. 3, for example, shows the equivalence between three HLEs 200a, b, and c and the LUT circuitry 32/34/ETC. of an ALE 10 performing a particular six-input logical combination. FIG. 3 also shows the equivalence between two more HLEs 200d and e and flip-flop circuitry 142 or 144 of an ALE 10 (which can be the same ALE as is performing the six-input logical combination shown in FIG. 3). It should be understood that HLEs 200a-e are shown greatly simplified in FIG. 3. For the most part only the HLE circuit elements and connections that are actually in use are shown in FIG. 3. All the other HLE circuitry that is shown in FIG. 2 is actually present in each HLE 200a-e, but some of this detail is omitted from the FIG. 3 depiction (or shown using lighter lines) to simplify FIG. 3. Multiple HLEs 200 that are used together (e.g., to perform combinational logic equivalent to what can be performed in LUT circuitry of an ALE, or to perform a register function equivalent to what can be performed in flip-flop circuitry of an ALE) may be referred to as a cluster of HLEs or CHLE. FIG. 3 therefore shows two CHLEs 202a and 202b.

Figure 10:
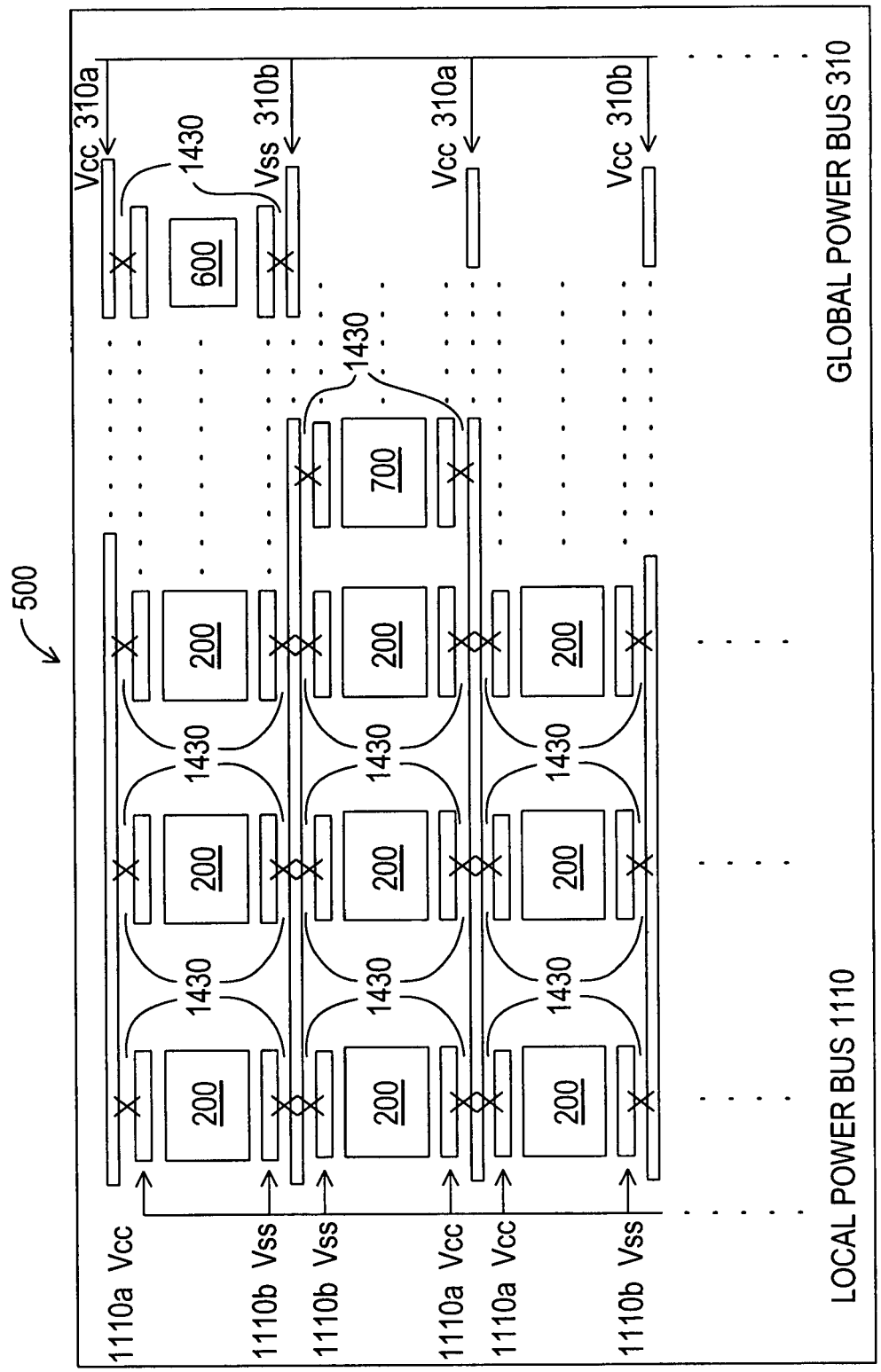
FIG. 10 is a simplified block diagram showing an illustrative arrangement of HLEs on an ASIC in accordance with the present invention.

FIG. 10 shows an illustrative arrangement of HLEs 200 on an integrated circuit device 500 in accordance with a preferred embodiment of the present invention. HLEs 200 in FIG. 10 may be constructed as shown in FIG. 3 or any other FIG. herein, or they may include any of the modifications referred to anywhere in this specification. In the illustrative arrangement shown in FIG. 10, HLEs 200 are disposed on device 500 in a two-dimensional array of intersecting rows and columns. Device 500 may also include other hard circuit blocks, such as I/O blocks 600, memory blocks 700, DSP blocks, PLL blocks, etc. (not shown). If device 500 is to be used as an ASIC equivalent of an FPGA, device 500 can generally be provided with a total number of HLEs 200 that is less than the number of LEs on the FPGA times the maximum number of HLEs 200 required to reproduce all the capabilities of one FPGA LE. This is so because only as many HLEs are used to perform the function(s) of each FPGA LE as are required, and in many cases fewer than the maximum number of HLEs are needed for this purpose.

Still, however, in a typical structured LE or HLE ASIC design, some active devices are unusable due to routing or placement constraints. Accordingly, this invention addresses the desirability of being able to programmably power down a structured application-specific integrated circuit by totally disconnecting power from the unused circuit blocks to reduce the leakage current.

In accordance with the present invention, a plurality of local power bus lines 1110 (each with an associated VCC conductor 1110a and an associated VSS conductor 1110b) are provided on device 500. Each one of the local power bus lines 1110 is associated with a respective hard logic block (e.g., LE module 200) in the ASIC design, as shown in FIG. 10. While the local power bus line 1110 of each logic block is terminated at the boundary of its associated block, the global power bus line 310 (with its associated VCC conductor 310a and associated VSS conductor 310b, as described above with respect to FIG. 2) is routed through all the hard circuit blocks of device 500 in each of the particular rows. In accordance with the present invention, connections 1430, which may be similar to connections 430 described above with respect to FIGS. 3, 6, and 7, may be programmable to selectively power down each circuit block (e.g., logic module 200, I/O block 600, memory block 700, etc.) by disconnecting its associated local power bus line 1110 from the global power bus line 310. Therefore, each hard circuit block can be powered down separately throughout the chip according to its actual usage to reduce leakage power.

Figure 11A:
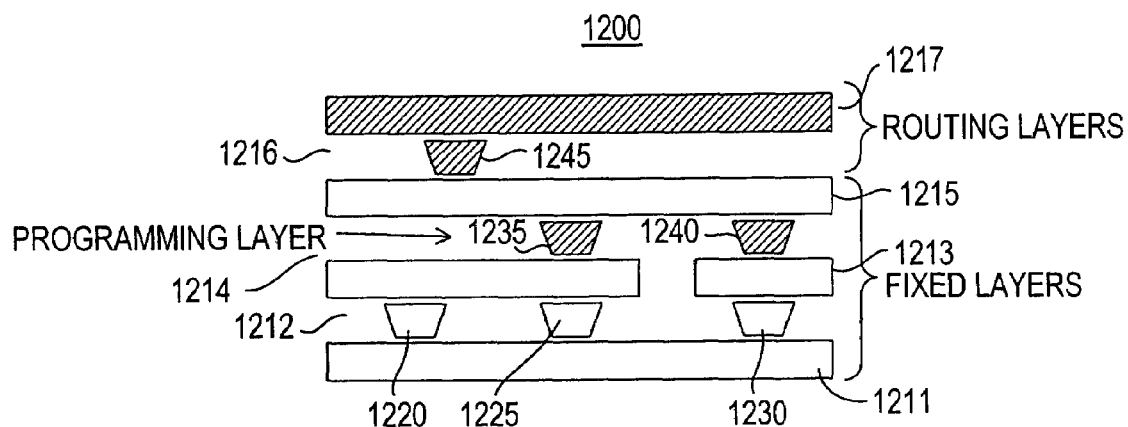
FIG. 11A is a diagramatic cross-sectional representation of a first embodiment of a logic module in a known ASIC device with representative via programming layers.

FIG. 11A shows one embodiment of a portion of a known structured ASIC device 1200 having seven layers 1211-1217. Layers 1211, 1213, 1215, and 1217 are metal layers, while layers 1212, 1214, and 1216 are semiconductor layers including vias 1220, 1225, 1230, 1235, 1240, and 1245. Layers 1211-1215 preferably are "fixed" layers representing the base of structured ASIC device 1200, while layers 1216 and 1217 preferably represent programming layers. Preferably, although most programming is provided by connections established by layers 1216 and 1217, some programming preferably also is accomplished by programming at least a portion of "fixed" layer 1214, which preferably contains at least one programmable via (see, e.g., vias 1235 and 1240). In addition, while only two programming layers 1216 and 1217 are shown, there could be additional programming layers. Similarly, there could be additional fixed layers (not shown) beyond layers 1211-1215. Programmable structures are shown in phantom. Thus, in this example, all of metallization layer 1217 is shown in phantom, while via 1245 of layer 1216 and vias 1235 and 1240 of layer 1214 are also shown in phantom.

Figure 11B:
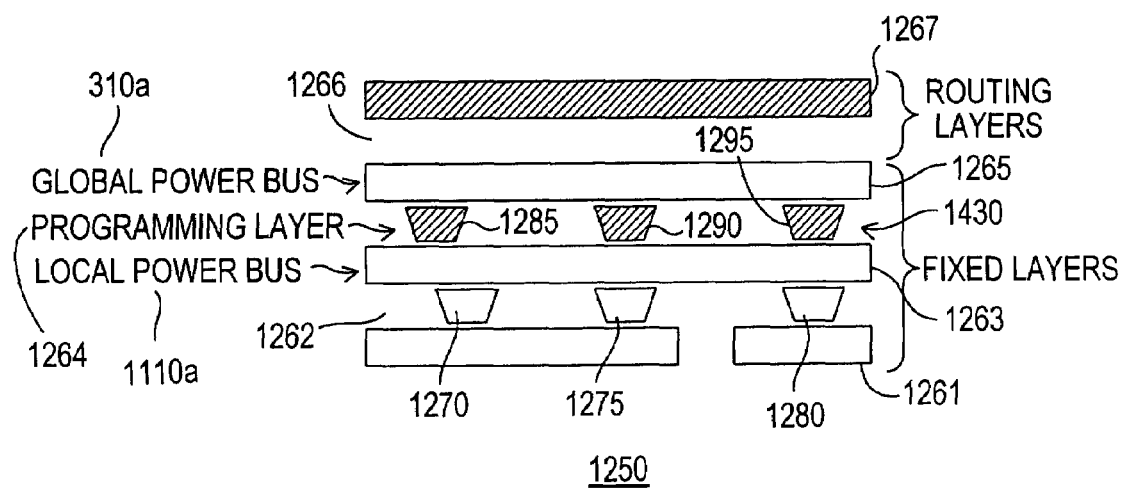
FIG. 11B is a diagramatic cross-sectional representation of a first embodiment of a logic module in an ASIC device in accordance with the present invention, with representative via programming layers.

In accordance with a preferred embodiment of the present invention, local power bus line 1110 may be defined along a portion of a layer of each logic module that may be programmably coupled to global power bus line 310 through a programmable layer of each logic module previously used for programming the functionality of that macrocell. FIG. 11B shows a portion 1250 of a structured ASIC device having seven layers 1261-1267 in accordance with the present invention. Layers 1261, 1263, 1265, and 1267 are metal layers, while layers 1262, 1264, and 1266 are semiconductor layers including vias 1270, 1275, 1280, 1285, 1290, and 1295. As shown, a portion of layer 1263 is utilized as local power bus line 1110 (particularly VCC conductor 1110a, for example) adjacent layer 1265, at least a portion of which is utilized as global power bus line 310 (particularly VCC conductor 310a, for example). Programming layer 1264 between layers 1263 and 1265 is utilized as the programmable power source layer according to the present invention. Vias 1285, 1290, and 1295 of programming layer 1264 may provide for programmable connection 1430 of the present invention that programmably couples the portion of layer 1263 utilized as local power bus line 1110 to its associated global power bus line 310 of layer 1265.

Accordingly, the circuit block constructed at portion 1250 may be powered down by programmably removing vias 1285, 1290, and 1295, if that circuit block is not to be used, in order to reduce leakage power. By creating clear programmable boundaries between global and local power lines, the ability to programmably power down unused hard circuit blocks of the structured ASIC is provided, preferably utilizing a portion of one of the programmable layers of the structured ASIC that frequently provides some programmability as between or among a small number of alternative functions. To reduce power drop as much as possible across the structured ASIC, multiple vias (e.g., vias 1285, 1290, and 1295) are used to provide for programmable connection 1430 between a local power bus line 1110 and a global power bus line 310. It is to be understood that, while the portion of layer 1263 shown in FIG. 11B is utilized as a local power bus line for programmable connection to a global bus power line, other portions of layer 1263 (not shown) may be utilized similarly to layer 1213 of FIG. 11A for providing functionality to the structured ASIC. It is also to be understood that any contact points of the hard circuit block (e.g., block 200) that may be powered down without disrupting the overall functionality of the structured ASIC may be coupled to the portion of layer 1263 utilized as local power bus line 1110 such that they may be programmably powered down through layer 1264 according to the present invention.

As is desirable in ASIC designs, the number of layers requiring customization (programming) in a device in accordance with the invention is preferably relatively small. Illustrative layers requiring customization in what has been described thus far are primarily the layer providing programmable vias 420/440 (FIGS. 4 and 6) between the horizontal and vertical interconnection conductors of the HLEs and the like, the layer providing programmable vias 470 (FIG. 8) for the I/O ports to the higher level interconnection circuitry, the layer providing programmable connection 1430 (FIG. 11B) between the global power bus line and the local power bus line, and the layer(s) providing the higher level interconnection circuitry itself. (Alternatively, all I/O port vias 470 can always be present and either connected to higher level interconnection circuitry if needed (used), or bypassed by that circuitry if not needed (not used), for example.)

Although via programming is generally referred to herein (see, e.g., FIGS. 4-9, 11A, and 11B) for powering down circuit blocks, logic construction, and intra- and inter-HLE routing, it will be understood that other types of programming (e.g., programming using metal optional links, fuses, antifuses, CRAM control, Flash control, etc.) can be used instead or in addition if desired. If some of these other technologies are used, then above references to mask programming will also be understood to refer to these other programming technologies, which may be implemented other than by customized or partly customized masks.

Figure 12A:
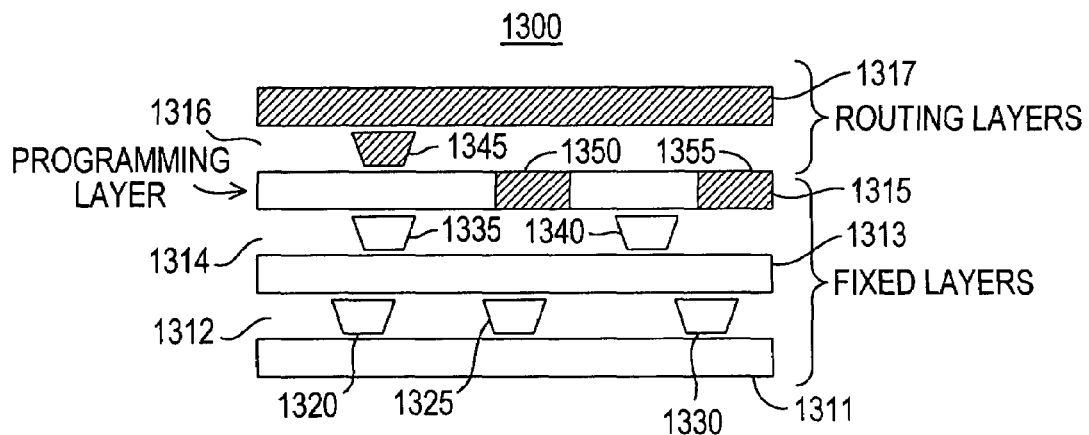
FIG. 12A is a diagramatic cross-sectional representation of a second embodiment of a logic module in a known ASIC device with representative metal programming layers.

For example, with respect to programming using metal, FIG. 12A shows one embodiment of a known structured ASIC device 1300 having seven layers 1311-1317. Layers 1311, 1313, 1315, and 1317 are metal layers, while layers 1312, 1314, and 1316 are semiconductor layers including vias 1320, 1325, 1330, 1335, 1340, and 1345. Layers 1311-1315 preferably are "fixed" layers representing the base of structured ASIC device 1300, while layers 1316 and 1317 preferably represent programming layers. Preferably, although most programming is provided by connections established by layers 1316 and 1317, some programming preferably also is accomplished by programming at least a portion of "fixed" layer 1315, which preferably contains at least one programmable metal element (see, e.g., elements 1350 and 1355). In addition, while only two programming layers 1316 and 1317 are shown, there could be additional programming layers. Similarly, there could be additional fixed layers (not shown) beyond layers 1311-1315. Programmable structures are shown in phantom. Thus, in this example, all of metallization layer 1317 is shown in phantom, while via 1345 of layer 1316 and programmable metal elements 1350 and 1355 of layer 1315 are also shown in phantom.

Figure 12B:
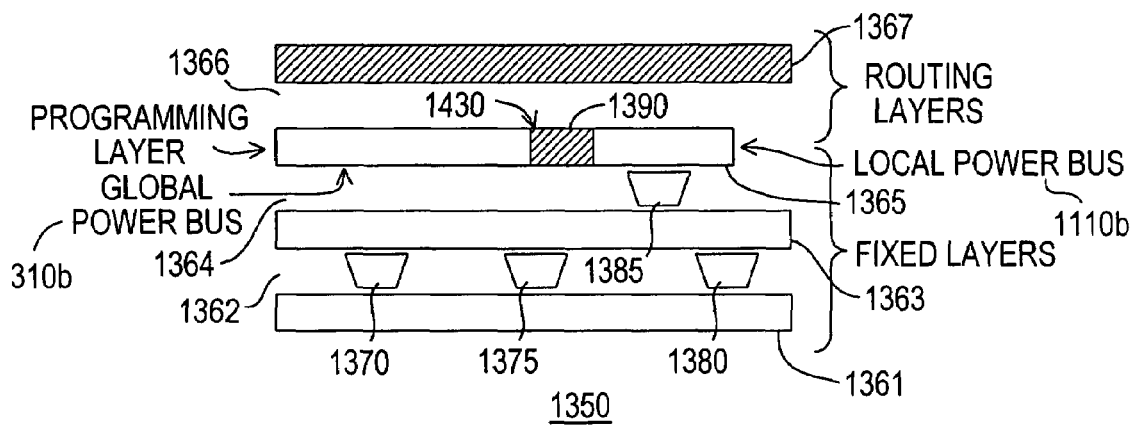
FIG. 12B is a diagramatic cross-sectional representation of a second embodiment of a logic module in an ASIC device in accordance with the present invention, with representative metal programming layers.

In accordance with a preferred embodiment of the present invention, local power bus line 1110 may be defined along a portion of a layer of each logic module that may be programmably coupled to global power bus line 310 through a programmable metal element of that same layer, preferably previously used for programming the functionality of that macrocell. FIG. 12B shows a portion 1350 of a structured ASIC device having seven layers 1361-1367 in accordance with the present invention. Layers 1361, 1363, 1365, and 1367 are metal layers, while layers 1362, 1364, and 1366 are semiconductor layers including vias 1370, 1375, 1380, and 1385. As shown, a portion of layer 1365 is utilized as local power bus line 1110 (particularly VSS conductor 1110b, for example), while an adjacent portion of layer 1365 is utilized as global power bus line 310 (particularly VSS conductor 310b, for example). Programmable metal element 1390, between the portions of layer 1365 utilized for bus lines 1110 and 310, is utilized as the programmable power down element according to the present invention. Programmable metal element 1390 of programming layer 1365 may provide for programmable connection 1430 of the present invention that programmably couples the portion of layer 1365 utilized as local power bus line 1110 to its associated global power bus line 310 of layer 1365.

Accordingly, the circuit block constructed at portion 1350 may be powered down by programmably removing metal element 1390, if that circuit block is not to be used, in order to reduce leakage power. By creating clear programmable boundaries between global and local power lines, the ability to programmably power down unused circuit blocks of the structured ASIC is provided utilizing a portion of one of the programmable layers of the structured ASIC that, preferably, frequently provides some programmability as between or among a small number of alternative functions.

Although HLEs are generally described herein as performing functions equivalent to FPGA LEs, HLEs as shown herein are high density and high performance components. As such, they can also be used to form high performance intellectual property ("IP") (e.g., digital signal processing ("DSP") blocks, microprocessors, or the like), memory, etc. Therefore, the programmable power-down features of the present invention may be utilized on these various other types of circuitry on the device.

Figure 13:
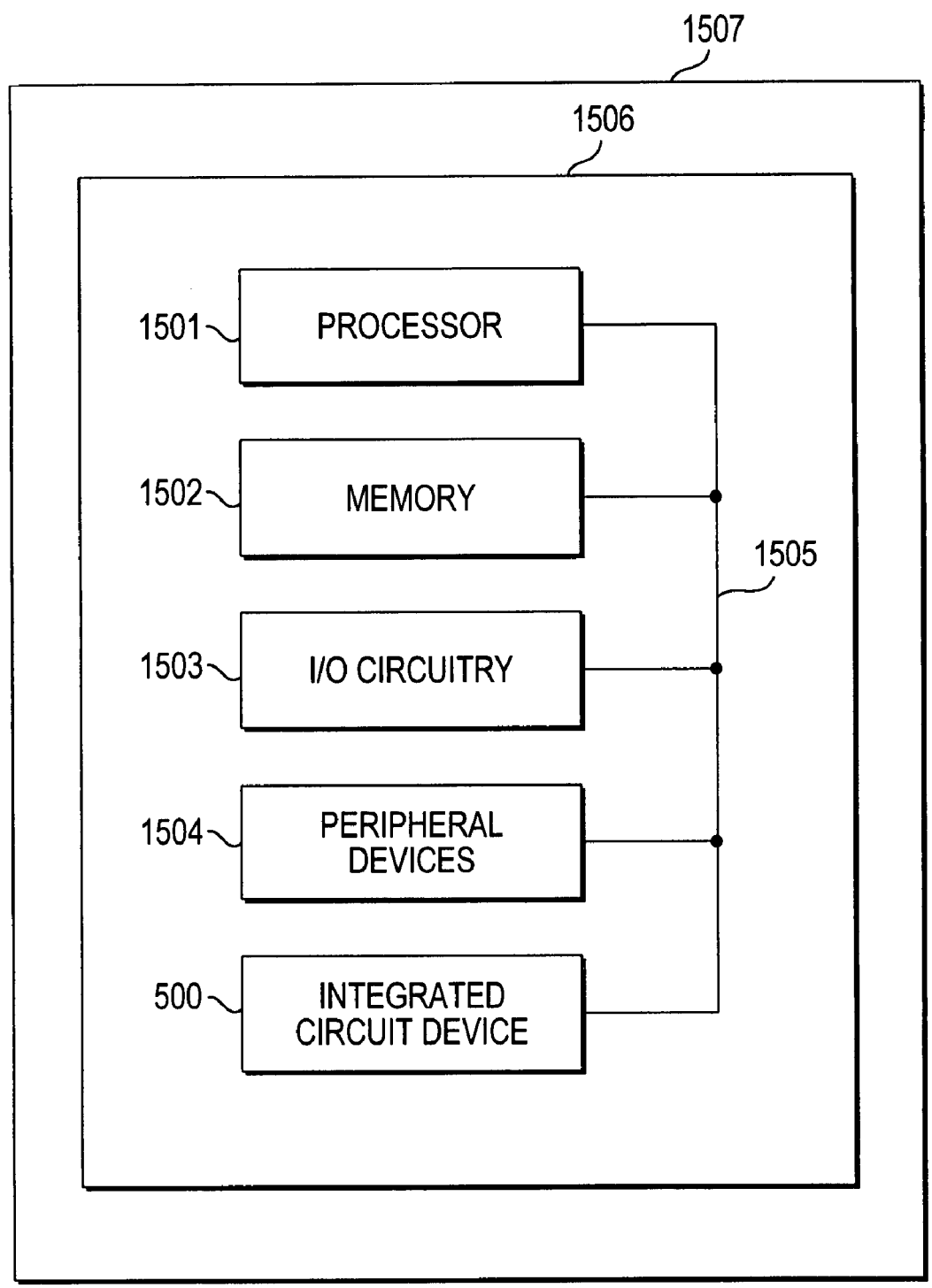
FIG. 13 is a simplified block diagram of an illustrative system employing an integrated circuit device having programmable power down circuitry in accordance with the present invention.

Integrated circuit device 500 constructed with programmable power down circuitry in accordance with the present invention, as described above, may be used as part of a data processing system 1500 shown in FIG. 13. Data processing system 1500 may include one or more of the following components: a processor 1501; memory 1502; I/O circuitry 1503; and peripheral devices 1504. These components are coupled together by a system bus 1505 and are populated on a circuit board 1506, which is contained in an end-user system 1507.

System 1500 can be used in a wide variety of applications, such as computer networking, data networking, instrumentation, video processing, digital signal processing, or any other application where the advantage of using structured ASIC is desirable. Integrated circuit device 500 can be configured to perform a variety of different logic functions. For example, circuit device 500 can be configured as a processor or controller that works in cooperation with processor 1501. Integrated circuit device 500 may also be used as an arbiter for arbitrating access to shared resources in system 1500. In yet another example, circuit device 500 can be configured as an interface between processor 1501 and one of the other components in system 1500. It should be noted that system 1500 is only exemplary, and that the true scope and spirit of the invention should be indicated by the following claims.

Various integrated circuit process technologies can be used to implement integrated circuit devices 500 as described above according to the present invention. In addition, other known signaling techniques such as low voltage differential signaling (LVDS) could be substituted for the single conductor signaling discussed above and still practice the principles of the invention.

It will be understood, therefore, that the foregoing is only illustrative of the principles of the invention, and that various modifications can be made by those skilled in the art without departing from the scope and spirit of the invention, and the present invention is limited only by the claims that follow.

What is claimed is:

1. A structured application-specific integrated circuit device comprising:
   a plurality of base semiconductor layers; and
   a plurality of base metallization layers, wherein said base layers form at least one hard circuit block at a first location, wherein a first portion of a first one of said metallization base layers at said first location is configured as a first global power bus line for said device, wherein a second portion of a second one of said metallization base layers at said first location is configured as a first local power bus line for said at least one hard circuit block, and wherein a third portion of a third one of said base layers is programmable to control the connection between said first portion and said second portion for programmably powering down said at least one hard circuit block, wherein said first one, said second one, and said third one of said base layers are the same metallization base layer, and wherein said third portion includes a programmable metal element between said first and second portions.

2. The structured application-specific integrated circuit device of claim 1, wherein a fourth portion of said third one of said base layers is programmable for configuring said at least one hard circuit block.

3. The structured application-specific integrated circuit device of claim 1, wherein said at least one hard circuit block is a hybrid logic element.

4. The structured application-specific integrated circuit device of claim 1, wherein said at least one hard circuit block is an I/O block.

5. The structured application-specific integrated circuit device of claim 1, wherein said at least one hard circuit block is a memory block.

6. The structured application-specific integrated circuit device of claim 1, wherein a fourth portion of a fourth one of said metallization base layers at said first location is configured as a second global power bus line for said device, wherein a fifth portion of a fifth one of said metallization base layers at said first location is configured as a second local power bus line for said at least one hard circuit block, and wherein a sixth portion of a sixth one of said base layers is programmable to control the connection between said fourth portion and said fifth portion for programmably powering down said at least one hard circuit block.

7. A digital processing system comprising:
   processing circuitry;
   a memory coupled to the processing circuitry; and
   said structured application-specific integrated circuit device of claim 1 coupled to the processing circuitry and the memory.

8. A printed circuit board on which is mounted said structured application-specific integrated circuit device of claim 1.

9. The printed circuit board defined in claim 8 further comprising:
   a memory mounted on the printed circuit board and coupled to the structured application-specific integrated circuit device.

10. The printed circuit board defined in claim 9 further comprising:
    processing circuitry mounted on the printed circuit board and coupled to the structured application-specific integrated circuit device.

11. A method of manufacturing a structured application-specific integrated circuit device for reducing leakage power, the method comprising:
    forming a plurality of base semiconductor layers on a substrate;
    forming a plurality of base metallization layers on said substrate, wherein said base layers form at least one hard circuit block at a first location;
    configuring a first portion of a first one of said metallization base layers at said first location as a global power bus line for said device;
    configuring a second portion of a second one of said metallization base layers at said first location as a local power bus line for said at least one hard circuit block; and
    configuring a third portion of a third one of said base layers as programmable to control the connection between said first portion and said second portion for programmably powering down said at least one hard circuit block, wherein said first one, said second one, and said third one of said base layers are the same metallization base layer, and wherein said third portion includes a programmable metal element between said first and second portions.

12. The method of claim 11, wherein a fourth portion of said third one of said base layers is programmable for configuring said at least one hard circuit block.

13. The method of claim 11, wherein said at least one hard circuit block is a hybrid logic element.

14. The method of claim 13, wherein said at least one hard circuit block is an I/O block.

* * * * *